United States Patent [19]

Groenewegen

[11] Patent Number: 4,694,119
[45] Date of Patent: Sep. 15, 1987

[54] HEAT SHIELDED MEMORY UNIT FOR AN AIRCRAFT FLIGHT DATA RECORDER

[75] Inventor: Johannes B. Groenewegen, Kirkland, Wash.

[73] Assignee: Sundstrand Data Control, Inc., Redmond, Wash.

[21] Appl. No.: 687,910

[22] Filed: Dec. 31, 1984

Related U.S. Application Data

[63] Continuation-in-part of Ser. No. 529,831, Sep. 7, 1983, abandoned.

[51] Int. Cl.$^4$ .............................................. H05K 5/04
[52] U.S. Cl. .................................. 174/52 PE; 169/48; 220/88 R
[58] Field of Search .................. 174/52 R, 52 PE; 220/88 R; 169/48; 109/82, 84

[56] References Cited

U.S. PATENT DOCUMENTS

| 2,586,873 | 2/1952 | Siple | 109/29 |
|---|---|---|---|
| 3,211,959 | 10/1965 | Kirk | 361/387 |
| 3,328,642 | 6/1967 | Haumesser et al. | 361/387 |
| 3,422,046 | 1/1969 | Thomas et al. | 252/606 |
| 3,478,819 | 11/1969 | Reinke | 165/32 |
| 3,559,594 | 2/1971 | Miller | 109/84 |
| 3,616,533 | 11/1971 | Heap et al. | 29/837 |
| 3,702,592 | 11/1972 | Gamble | 109/29 |
| 3,865,183 | 2/1975 | Roush | 165/80.4 |
| 3,916,804 | 11/1975 | Noone | 109/78 |
| 3,952,797 | 4/1976 | Voboril et al. | 165/80.4 |
| 4,018,585 | 4/1977 | Loratto | 62/372 |
| 4,028,467 | 6/1977 | Kleinschmidt et al. | 514/221 |
| 4,057,101 | 11/1977 | Ruka et al. | 165/1 |
| 4,079,161 | 3/1978 | Kile | 428/220 |
| 4,091,924 | 5/1978 | Newton | 206/389 |
| 4,100,860 | 7/1978 | Gablin et al. | 109/83 |
| 4,126,879 | 11/1978 | Kessler Jr. et al. | 357/82 |
| 4,131,053 | 12/1978 | Ferguson | 89/36.02 |
| 4,161,125 | 7/1979 | Degnan | 79/469 |
| 4,167,771 | 9/1979 | Simons | 361/386 |
| 4,193,441 | 3/1980 | Scaringe | 165/32 |
| 4,198,454 | 5/1980 | Norton | 428/117 |
| 4,219,072 | 8/1980 | Barlow, Sr. | 165/32 |
| 4,222,434 | 9/1980 | Clyde | 165/10 |
| 4,255,483 | 3/1981 | Byrd et al. | 428/245 |
| 4,263,365 | 4/1981 | Burgess et al. | 428/312.4 |
| 4,273,183 | 6/1981 | Altoz et al. | 165/32 |
| 4,279,292 | 7/1981 | Swiatosz | 165/61 |
| 4,292,590 | 9/1981 | Wilson | 324/226 |
| 4,304,294 | 12/1981 | Reisman et al. | 165/32 |
| 4,323,000 | 4/1982 | Dennis et al. | 89/36.02 |
| 4,345,002 | 8/1982 | Smith et al. | 428/288 |
| 4,352,851 | 10/1982 | Heitz et al. | 428/250 |
| 4,370,547 | 1/1983 | Ward | 219/497 |
| 4,372,373 | 2/1983 | Haugeneder et al. | 165/54 |
| 4,373,003 | 2/1983 | Schomburg et al. | 428/241 |
| 4,446,916 | 5/1984 | Hayes | 165/104.17 X |
| 4,473,113 | 9/1984 | Whitfield et al. | 165/185 |

OTHER PUBLICATIONS

"Poly Alcohol Solid Phase–Change Materials Studied" SERI In Review, Mar. 1983, vol. V, No. e.
"Parametric Study of Thermal Protection Concepts for Airborne Recorded Tapes in a Severe Crash Environment," Sep. 1969, report prepared by Richard B. Hulett.

Primary Examiner—Arthur T. Grimley
Assistant Examiner—D. A. Tone
Attorney, Agent, or Firm—Christensen, O'Connor, Johnson & Kindness

[57] ABSTRACT

Solid state memory devices employed in crash survivable flight data recorders must be thermally insulated to prevent loss of stored data if the aircraft burns. To provide adequate thermal isolation at minimal size, the solid state electronic memory devices (26) are encapsulated in a synthetic organic wax or pentaerythritol (28) that exhibits a phase transition at a temperature: (a) above the normal operating temperature of the memory unit (10); and below the maximum acceptable peak temperature for the memory devices (26). The synthetic organic wax of pentaerythritol (28) is surrounded by a thermal liner (18) constructed of solid thermal insulating material. A metal enclosure (12) houses and protects the thermal liner (18), the synthetic organic was or pentaerythritol (28) and the memory devices (26).

4 Claims, 4 Drawing Figures

HEAT SHIELDED MEMORY UNIT FOR AN AIRCRAFT FLIGHT DATA RECORDER

RELATED APPLICATIONS

This application is a continuation-in-part of application Ser. No. 529,831, filed Sep. 7, 1983 and now abandoned.

BACKGROUND OF THE INVENTION

This invention relates to heat shielded enclosures for protecting and preserving a device or assembly from an otherwise destructive high temperature environment and, particularly, to heat shielded enclosures wherein enclosure size and weight is an important consideration. In the disclosed embodiment, this invention specifically relates to a compact, lightweight memory unit for use in a crash survivable aircraft flight data recorder wherein the memory unit is configured to withstand an aircraft crash and an ensuing fire with little or no loss of stored data.

Although there are numerous situations in which it is necessary or desirable to protect an item, device or assembly from deleterious exposure to a high temperature environment, shielding the memory device of an aircraft flight recorder system during crash and a fire presents extremely demanding design constraints. In this regard, in order to preserve flight data supplied to the memory unit by the flight data recorder data acquisition unit during a predetermined time interval immediately prior to an aircraft crash, the memory unit must be configured and arranged to withstand temperatures in excess of 1100° C. (approximately 2000° F.), experienced during a fire while simultaneously being constructed to endure crushing and penetration forces experienced either on impact or during secondary impact with other portions or pieces of the aircraft. Further, the memory unit of a flight data recorder system is subject to additional design constraints imposed by considerations generally applicable to aircraft equipment and systems, including constraints relating to size, weight, cost, serviceability and reliability.

Technical advances in the various electronic solid state device arts have led to high capacity electronic memory devices for nonvolatile storage of digitally encoded data with programmable read only field effect transistor devices and bubble memory devices being two types of such memories. Because such devices are small and lightweight and exhibit high reliability, there has been substantial impetus for replacing the magnetic tape transports utilized in current flight recorder system designs with solid state memories.

Because of increased heat shielding demands, the currently employed technique of mounting a tape transport or other flight data recorder memory device within a cavity that is formed by encasing the memory device with a solid material that is a relatively good thermal insulator and surrounding that assemblage with a protective metal housing does not achieve the desired overall reduction in memory unit size and weight that might be obtained in flight data recorder systems employing semiconductor memory devices such as erasable programmable read only memories.

SUMMARY OF THE INVENTION

In accordance with this invention relatively compact and lightweight heat shielding is achieved by using a thermal insulator that exhibits a phase transition as at least a portion of the heat shielding structure that encases or surrounds the device to be thermally protected. The temperature at which the phase transition occurs is selected to be: (a) above the peak temperature encountered under normal operating conditions; and (b) at or below the peak temperature objective for the device being protected. When subjected to a fire or other high temperature environment, the material exhibiting the phase transition (and any other thermal insulation utilized) initially serves as a conventional heat shield by exhibiting relatively high thermal inertia. When the material that exhibits the phase transition reaches the transition point, it in effect serves as a heat sink since heat energy reaching that material is then utilized to convert the material from a solid state to a liquid (heat or fusion) or convert the material from one solid state to another. This maintains the maximum temperature attained during exposure to a high temperature environment at an acceptable level.

The currently preferred embodiments of the invention are configured for maintaining solid state electronic memory devices of a flight data recorder at or below a maximum temperature of 200° C. (approximately 390° F.) when the flight data recorder memory unit is exposed to a fire that produces temperatures of 1100° C. (approximately 2000° F.) for a period of 0.5 hours and the memory unit is left undisturbed for an additional 4 hours. In these embodiments, the preferred phase transition is a synthetic organic amide wax. One amide wax that has proven successful in experimental use of the invention is a proprietary formulation distributed under the tradename HM 23 by Glyco Inc., of Greenwich, Conn. Other such synthetic waxes include, for example, the wax chemically defined as N,N' ethylenebisstearamide (or by its synonym N,N' distearoylethylenediamine) which has an empirical chemical configuration of $H_{35}C_{17}COHNC_2H_4NHCOC_{17}H_{35}$ wherein the alkyd radials extend linearly from the amide linkages on either side of the molecule. In addition, an organic solid solution of pentaerythritol ($C_5H_{12}O_4$) can be employed.

With respect to the physical configuration, the flight data recorder memory unit disclosed herein includes an outer housing constructed of metal that exhibits a high thermal conductivity and high resistance to crushing and piercing. An intumescent coating or paint is generally applied to the exterior surfaces of the outer housing for additional thermal insulation. An insulating layer of solid material that exhibits a relatively low thermal conductivity adjoins each interior surface of the outer housing to form a rectangular cavity that is centrally located within the outer housing. One or more printed circuit boards, which include the solid state electronic memory devices being protected, are mounted within a metal innerhousing that nests within the central cavity with the synthetic wax material surrounding and encapsulating the printed circuit boards. Electrical connection between the solid state electronic memory devices and a remotely located flight data recorder data acquisition unit is facilitated by a flexible, ribbon-type multiconductor cable that innerconnects the printed circuit board with an electrical connector that is mounted to the exterior of the outer housing.

BRIEF DESCRIPTION OF THE DRAWING

The various aspects of the present invention will be understood more fully after reading the following description taken together with the accompanying drawing in which.

DETAILED DESCRIPTION

Figure 1:
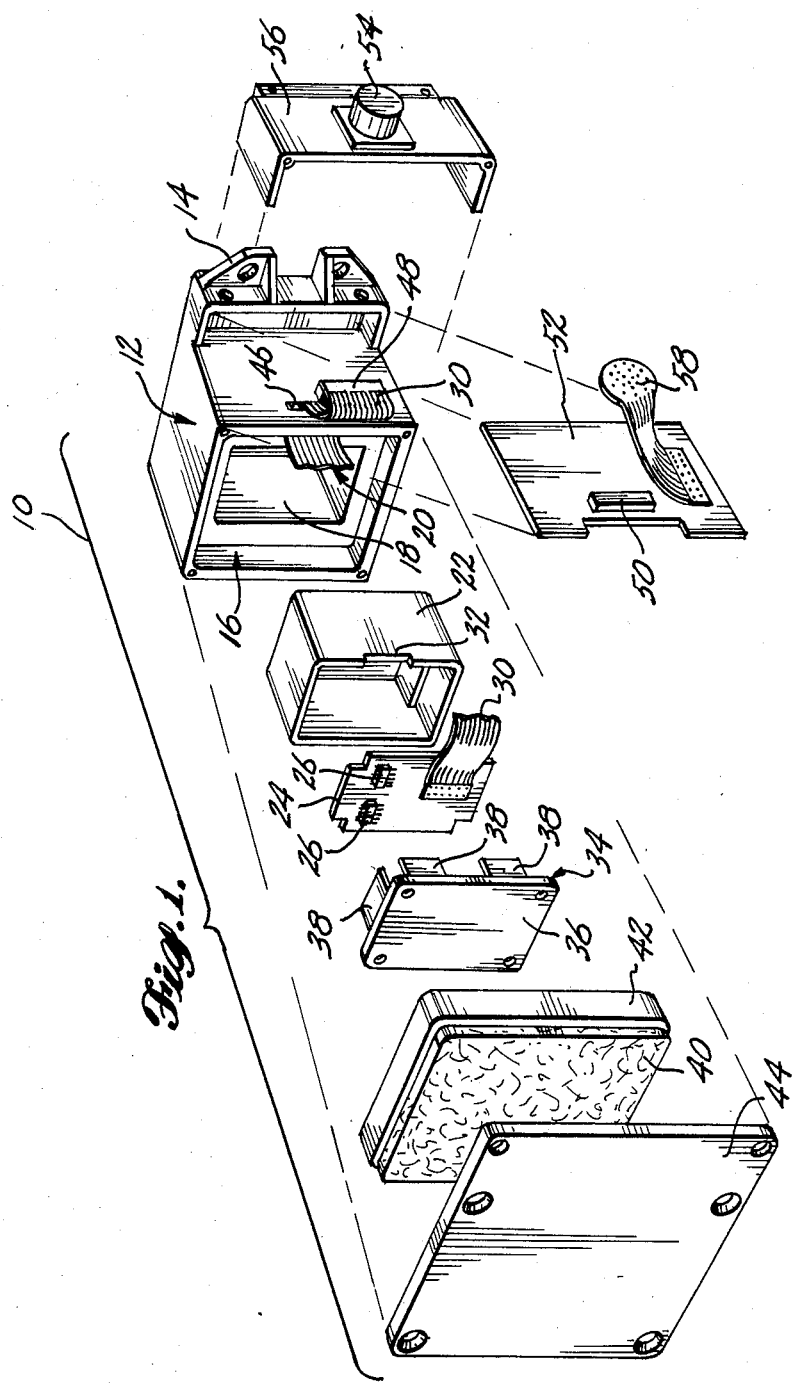
FIG. 1 is an exploded view of a flight data recorder memory unit configured in accordance with this invention.
Figure 2:
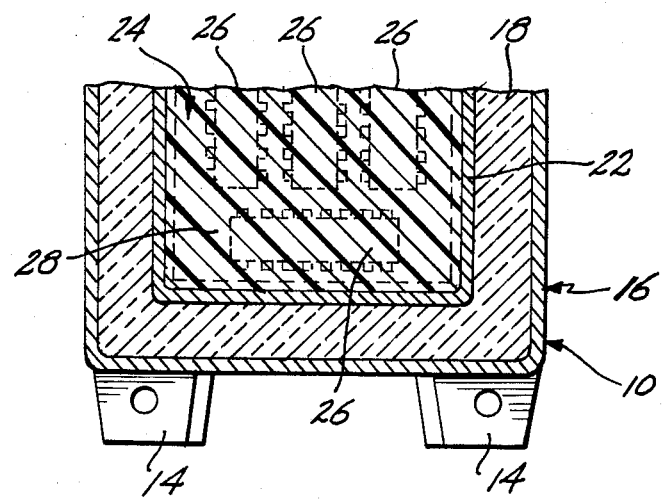
FIG. 2 is a partial cross-sectional plan view of the flight data recorder memory unit of FIG. 1.

A thermally protected flight data recorder system memory unit configured in accordance with this invention is illustrated by FIGS. 1 and 2 and is generally denoted herein by the reference numeral 10. As is known in the art, such a memory unit is configured to provide a record of various important aircraft performance parameters over a predetermined time interval that occurs immediately prior to each time the flight data recorder is activated (including deactiviation which occurs if the aircraft crashes). In operation, the information stored within the memory unit is ongoingly supplied by additional components of the flight data recorder system such as a data acquisition unit that receives input signals from various aircraft sensors and systems, and processes those signals to produce signals compatible with the recording or storage medium employed by the flight data recorder memory unit. In the case of the disclosed embodiment of the invention, which utilizes a solid state electronic device such as semiconductor electronically erasable programmable read-only memory circuits as the information storage medium, the data acquisition unit periodically supplies digital signals which are sequentially written into the semiconductor memory circuits so that the memory circuits store a sequence of digital words that is a time sampled data representation of the history for each parameter being monitored. Typically, with respect to currently employed techniques, data compression is generally employed to allow storing digital signals representative of a 15-30 minute time history for each monitored parameter.

As is shown in FIGS. 1 and 2, the present embodiment of the flight data recorder system memory unit of this invention includes a metal outer housing 12 that is substantially rectangular in cross section when viewed perpendicular to each of its major axes. Flanges 14 extend orthoganally from oppositely disposed edges of the base of outer housing 12 to facilitate mounting memory unit 10 at a convenient location within the aircraft by means of bolts or other conventional fasteners. A substantially rectangular cavity 16 extends inwardly from one face of outer housing 12 toward the base of memory unit 10 so that the major portion of outer housing 12 is configured as a substantially rectangular shell. Outer housing 12 is constructed of a titanium alloy or other material that exhibits relatively low density, relatively high thermal conductance and relatively high resistance to crushing and penetration with the wall regions that are defined between cavity 16 and the outer surfaces of outer housing 12 being dimensioned to withstand crushing and penetration should the aircraft crash. An intumescent coating or paint (17 in FIG. 2) is applied to the outer surfaces of outer housing 12 to provide thermal insulation during the initial phases of a fire. Such materials are known in the art and include a paint distributed by the Specialty Materials Division of AVCO of Lowell, Mass. under the trademark FLAMAREST 1000.

A shell-like thermal liner 18, nested within cavity 16 of outer shell 12, provides a first thermal barrier for shielding components that are located in the interior regions of memory unit 10 from high temperature fires that may occur during such an aircraft crash. Thermal liner 18 is substantially rectangular in cross-sectional geometry relative to each of its major axes and forms an inwardly extending cavity 20 that is coaxially positioned within cavity 16 of outer housing 12. Thermal liner 18 is preferably a unitary structure that is formed of a solid material that is a good thermal insulator (i.e., has a low thermal conductivity, K) and relatively low density. Suitable materials include thermal insulators that are proprietary combinations of fibrous material and very fine particulate matter with MIN-K 2000 and MICROTHERM being the trademarks for two such satisfactory materials that are manufactured by Johns-Manville Co. of Denver, Colo. and by Micropore Insulation, Ltd. of Upton-Wirral Merseyside, England, respectively. Because it exhibits very low thermal conductivity e.g., $K=0.146$ at 170° C., $K=0.27$ at 1100° C., the material marketed under the trademark MICROTHERM is currently the preferred material for thermal liner 18.

As is best illustrated by FIG. 1, a relatively thin walled central shell 22 that nests within cavity 20 receives and contains one or more printed circuit boards 24 that provide physical support for and electrical innerconnection for a number of solid state memory devices 26. Although the arrangement of FIG. 1 depicts a conventional printed circuit arrangement wherein each solid state memory device is encapsulated to form what is known as a dual in-line package, other configurations can be employed. For example, in some realizations of the invention it may be advantageous to bond semiconductor chips that contain circuitry for a number of electronically erasable programmable read only memories directly to a ceramic substrate or other carrier that includes electrical innerconnections that are vacuum deposited or otherwise formed thereon. In any case, central shell 22 is preferably formed from a material such as stainless steel or another metal that presents a reasonable density-heat capacity trade off (i.e., the product of material density times heat capacity is relatively high) and that also is easily worked or formed. Further, each printed circuit board 24 is mounted within central shell 22 so that each solid state memory device 26 is spaced apart from the inner surfaces of central shell 22.

Figure 3:
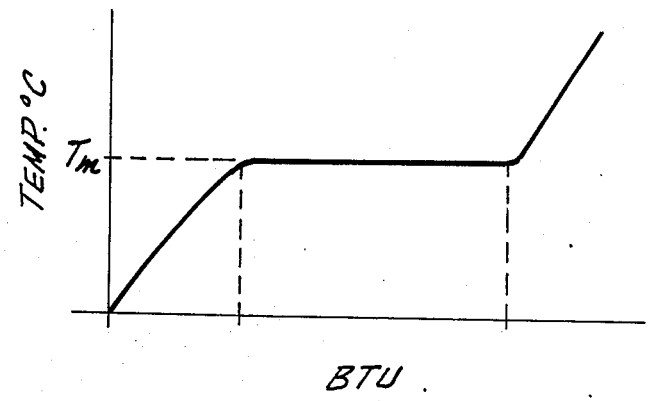
FIG. 3 depicts a phase diagram of the encapsulating synthetic organic wax utilized in the embodiment of FIGS. 1 and 2.

To provide the high degree of heat shielding effected by this invention, the open regions between the inner walls of central shell 22, printed circuit board 24 and adjacent solid state memories 26 are filled by an insulator (28 in FIG. 2) that exhibits a phase transition at or below the desired temperature limit for solid state memories 26. As is graphically illustrated by FIG. 3, such a material is characterized by a first temmperature range wherein an increase in the heat energy supplied to the material results in a corresponding linear increase in material temperature (material below its transition point, $T_m$ in FIG. 3) and is further characterized by a relatively constant temperature region wherein an increase in the heat energy supplied causes the material to change states. As is schematically illustrated in FIG. 3, continued increases in the heat energy supplied to such a material after it reaches the molten state generally will cause the material to experience a second change in phase (i.e., vaporize, or in the case of pentaerythritol, melt) with additional increases in the supplied heat energy causing a temperature increase in the generated vapor or liquid. This latter characteristic is of importance to the present invention only in that the insulator 28 that is employed in the practice of the invention is selected so that little or no vaporization (or melting of pentaerythritol) occurs when memory unit 10 of FIG. 1 is subjected to a high temperature environment associated with a burning aircraft.

The phase transition thermal insulator material currently employed in the practice of the invention are amide-type synthetic organix waxes and a solid solution of pentaerythritol ($C_5H_{12}O_4$). One amide wax that is successfully employed in a prototype embodiment of the invention is a proprietary formulation of Glyco, Inc. of Greenwich, Conn., which is marketed under the trade name HM 23. Other such waxes are commercially available, including a wax chemically defined as N,N′-ethylenebisstearamide (or by the synonym N,N′ distearoylethylenediamine) having a chemical configuration of $H_{35}C_{17}COHNC_2H_4NHCOC_{17}H_{35}$ wherein the alkyd radials extend linearly from amide linkages on either side of the molecule. This synthetic wax also is available from Glyco, Inc. of Greenwich, Conn. under the trademark ACRAWAX C. Both of the two above specifically referenced synthetic waxes currently are utilized in numerous commercial applications that are not related to this invention.

With respect to the present invention, the above-referenced amide wax marketed under the trade name HM 23 is advantageous because it exhibits a high flash point (277° C.) and melting point (193° C.) that has been found to suitably protect the solid state memory devices that are utilized in a flight data recorder system that is being developed by the assignee of this invention. Use of N,N′ ethylenebisstearamide (flash point 271° C., melting point 143° C.) can be advantageous wherein a lower melting point is desirable. Further, both of these materials are amenable to conventional manufacturing processes since they are nontoxic and are available in various particulate forms.

Pentaerythritol, which is a poly-alcohol having a tetrahedral structure having a central carbon atom attached to four outer carbon atoms that are located at the vertices of a regular tetrahedron, also can be advantageously employed. This material exhibits a melting point of between 258° C. and 260° C., a solid state transition temperature of 184°–185° C., and a latent heat of transition of approximately 72 calories/gram.

Referring again to FIGS. 1 and 2 and the physical configuration of memory unit 10, electrical connection to printed circuit board 24 is provided by means of a flexible, flat cable assembly 30 that is constructed of a polyamide ribbon or other such material that includes a series of spaced apart conductive strips. When printed circuit board 24 is placed in central shell 22, cable 30 extends through a rectangular notch 32 that is formed in one boundary edge of central shell 22. Central shell 22 is then filled with melted synthetic organic wax or pentaerythritol to encapsulate printed circuit board 24, solid state electronic memory devices 36 and cable 30. An inner cover assembly 34, which includes a rectangular metal plate 36 and flanges 38 that extend orthogonally therefrom for abutment with the interior walls of central shell 22, substantially seals inner shell 22 for containment of meltable insulator 28 (the synthetic organix wax or pentaerythritol) that melts during an aircraft crash and fire.

Thermal isolation for the face of central shell 22 is defined by cover assembly 34 is provided by a substantially rectangular thermal insulator 40 that is constructed of the same material utilized in forming thermal liner 16 (e.g., the previously mentioned MICROTHERM insulator). As is shown in FIG. 1, thermal insulator 40 preferably is covered with a fiberglass reinforced resin 42 (or other durable material) to protect thermal insulator 40.

A second substantially rectangular cover plate 44 that is constructed of the same material as outer housing 12 covers the open face of outer housing 12 so as to fully enclose memory unit 10 in a manner that substantially seals the unit and provides substantially identical thermal conductance relative to heat energy that is coupled through each rectangular face of memory unit 10.

With particular reference to FIG. 1, electrical cable 30 exits cavity 16 of outer housing 12 through a rectangular slot 46 that is formed in one wall of outer housing 12. A connector 48 at the outward terminus of cable 30 mates with a connector 50 that is located on a printed circuit board 52. In the depicted embodiment, printed circuit board 52 is mounted substantially parallel to the face of outer housing 12 that includes slot 46 and contains conventional electronic interface or control circuitry (not shown in FIG. 1) for sequentially addressing solid state memory devices 26 during operation of the flight data recorder system. Although this control circuitry need not survive a fire in order to preserve the data stored in solid state memory devices 26, it is preferably mounted within memory unit 10 in order to eliminate data errors that might otherwise be caused by electromagnetic interference and various other signal transients encountered in aircraft electrical systems.

To complete memory unit 10 and provide electrical connection between the system data acquisition unit and printed circuit board 52, memory unit 10 includes an electrical connector 54 that passes through the major face of a substantially U-shaped flange 56. As is indicated in FIG. 1, flange 56 is mounted to outer housing 12 with connector 54 spaced apart from circuit board 52. A suitably configured ribbon-type cable assembly 58 provides electrical interconnection between connector 54 and printed circuit board 52.

Figure 4:
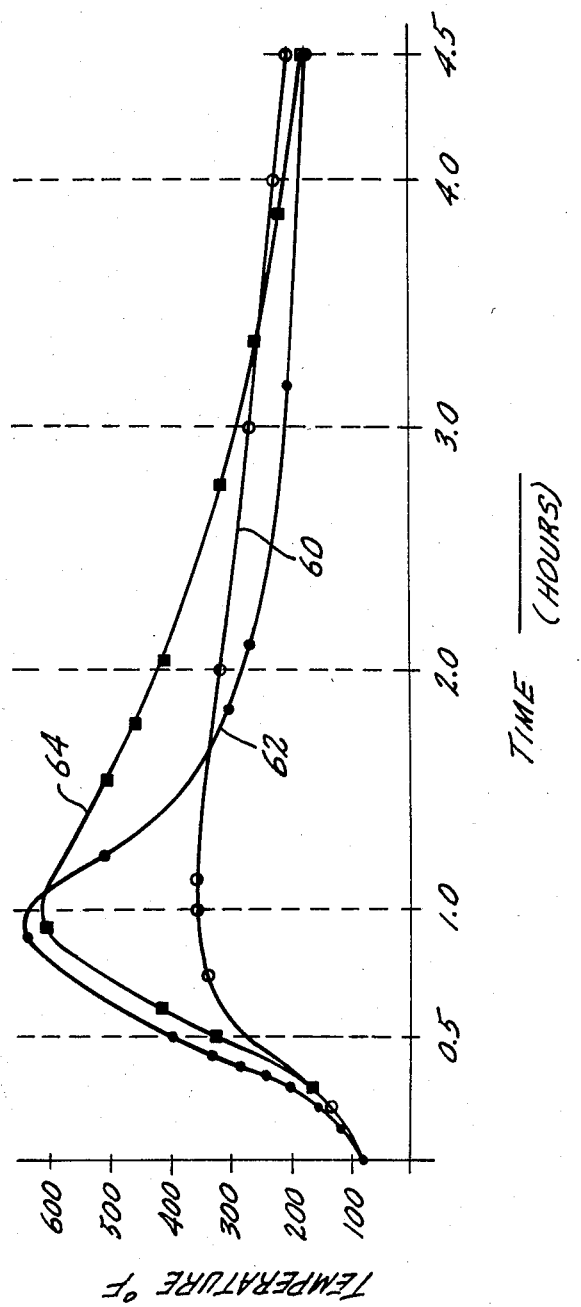
FIG. 4 graphically depicts the temperature versus time characteristics of one realization of the invention as well as the time versus temperature characteristics of flight data recorder memory units of the same size but which employ only conventional solid insulator material.

The degrees of thermal isolation achieved by the practice of this invention is illustrated by FIG. 4, which depicts the temperature versus time characteristics of a flight data recorder memory unit constructed in accordance with the invention (curve 60 in FIG. 4) and the temperature versus time characteristics of two memory units identical in size thereto which do not include an insulator 28 that exhibits a phase transition, but employ substantially thicker thermal liners 18 constructed of the previously mentioned material that is marketed under the trademarks MIN-K 2000 and MICROTHERM (curves 62 and 64 in FIG. 4, respectively). Each of the three memory units utilized to provide the data of FIG. 4 are 3 inches high (7.62 centimeters) by 4.8 inches long (12.2 centimeters) by 4.5 inches wide (11.4 centimeters) with the wall thickness of outer housing 12 being 0.125 inches (0.32 centimeters). Thus, the rectangular cavity formed within the outer housing of the three memory units that produced the data set forth in FIG. 4 is approximately 2.75 inches high (7 centimeters), approximately 4.55 inches long (11.6 centimeters) and approximately 4.25 inches wide (10.8 centimeters). In both of the memory units that include MIN-K 2000 or MICROTHERM insulation without inclusion of a meltable insulator the thickness of the solid thermal liner is approximately 0.9 inches (2.3 centimeters). In contrast, the memory unit configured in accordance with the invention (curve 60) utilizes a 0.6 inch thickness (1.5 centimeters) of MICROTHERM insulator as a thermal liner 16 to thereby form a central cavity (cavity 20 in FIG. 1) that is approximately 2.15 inches high (5.5 centimeters), approximately 3.35 inches long (8.5 centimeters), and approximately 3 inches wide (7.6 centimeters). Approximately 6.5 ounces (184 grams) of molten HM 23 amide wax (which exhibits a melting point of 193° C. (379° F.) is deposited in the central cavity to fully encapsulate circuit board 24 and associated solid state memory devices 26. The exterior surfaces of all three memory units include a sprayed-on coating (0.020 inches when dry; 0.5 centimeters) of the previously mentioned intumescent paint that is marketed under the trademark FLAMAREST 1000.

The thermal performance of the invention readily can be seen from FIG. 4, which depicts the temperature attained at or near the solid state memory devices when the tested memory units were subjected to a kerosene burner that produces temperatures on the order of 1100° C. (approximately 2000° F.) and heat flux on the order of 50,000 BTU/ft$^2$/hour for a period of 0.5 hours and and then allowed to remain undisturbed for 4 hours. First, and of primary importance, the maximum temperature reached with the tested embodiment of the invention is approximately 176.6° C. (350° F.) whereas the memory unit utilizing the MIN-K 2000 insulation reached a maximum temperature of approximately 337° C. (640° F.) and the memory unit utilizing MICROTHERM insulation reached a maximum temperature of approximately 318.3° C. (approximately 605° F.). Moreover, the memory unit utilizing MIN-K 2000 insulation (curve 62) attained maximum internal temperature approximately 39 minutes after ignition of the kerosene burner with the memory unit employing solely MICROTHERM insulation (curve 64) reaching maximum internal temperature approximately 55 minutes after the burner was ignited. In contrast, the tested embodiment of the invention exhibited thermal inertia exceeding that of both the memory units that employ solid insulation, reaching maximum internal temperature approximately 68 minutes after ignition of the kerosene burner.

With continued reference to FIG. 4, it also can be noted that the temperature attained within the tested embodiment of the invention at the termination of the 30 minute burner interval (137.8° C.; 280° F.) is substantially below the temperature attained within the memory units utilizing the MICROTHERM and MIN-K 2000 insulation (approximately 160.6° C. (321° F.) and approximately 204° C. (approximately 400° F.), respectively). Throughout the burner on period (time less than 30 minutes), and throughout the period required for tested memory units to reach peak internal temperature, the temperature of the tested embodiment remains below that of both of the memory units utilizing only MIN-K 2000 and MICROTHERM insulation. Since the synthetic organic wax that is utilized in the tested embodiment of the invention dissipates stored thermal energy at a slower rate than either MIN-K 2000 or MICROTHERM, the temperature of the tested embodiment of the invention is slightly higher than that of the two other memory units at the end of the test period shown in FIG. 4 (time equal 64.5 hours).

The difference between the temperature versus time characteristic of the invention and memory units containing only a solid thermal lining is especially important relative to preserving the digitally encoded information that is stored in solid state memory devices 26. In particular, the probability of destroying bits of stored data is not only a function of the peak temperature reached, but increases substantially in proportion to the amount of time that the memory devices are maintained at substantially high temperatures. As can be seen from FIG. 4 and ascertained from the foregoing discussion, the memory devices within the tested embodiment of the invention are subject to less heat energy than those within the memory units utilizing entirely MIN-K 2000 and MICROTHERM insulation. That is, since the area beneath curve 60 is less than the areas beneath curves 62 and 64, it can be recognized that the temperature versus time characteristics exhibited by the invention substantially reduce the probability of losing an unacceptable amount of stored flight data relative to comparably sized memory units employing only solid thermal liners.

Although the invention is described herein in terms of a currently preferred embodiment of a flight data recorder system, those skilled in the art will recognize that various modifications, alterations and substitutions can be made without departing from the scope and spirit of this invention. For example, although described in terms of a memory unit for an aircraft flight data recorder system, the invention may find application in other situations requiring compact and lightweight thermal insulation. Situations of this type can be expected to increase, especially with respect to aircraft and space vehicles, as more and more electronic systems that have been customarily realized by analog circuit designs are replaced by digital systems.

In addition, central shell 22 of the disclosed embodiment is not a necessary element of the invention and can be eliminated if necessary or desired. In this regard, the currently preferred embodiments of the invention employ central shell 22 for ease of assembly and as a container for housing for the portion of the flight data recorder memory unit that must be recovered in order to obtain the recorded flight data.

The embodiment of the invention in which an exclusive property or privilege is claimed are defined as follows:

1. An enclosure for thermally protecting one or more heat sensitive items from a high temperature environment, said enclosure comprising:
   a metal outer housing including an interior cavity for containing said one or more heat sensitive items;
   a first thermal insulator configured as a thermal liner that extends about the surface of said first interior cavity, said thermal liner defining a second interior cavity with said one or more heat sensitive items being spaced apart from the walls of said second interior cavity said first thermal insulator being a solid material and remaining solid when said enclosure is exposed to a high temperature environment; and
   an amide wax, said wax occupying at least a portion of said interior cavity and encapsulating said one or more heat sensitive items said amide wax exhibiting a phase transition at a predetermined temperature, said predetermined temperature being selected to maintain said amide wax in a solid phase when said enclosure is not exposed to said high temperature environment and being selected to allow conversion of said amide wax to a liquid phase when said enclosure is exposed to said high temperature environment.

2. The enclosure of claim 1 wherein each of said one or more heat sensitive items is a solid state electronic memory device for storing data which is to be recovered from each of said solid state electronic memory device following exposure of said enclosure to said high temperature environment.

3. The enclosure of claim 1 wherein said amide wax is chemically defined as N,N'ethylenebisstearamide and N,N'distearoylethlenediamine.

4. The enclosure of claim 3 wherein each of said one or more heat sensitive items is a solid state electronic memory device for storing data which is to be recovered from each of said solid state electronic memory device following exposure of said enclosure to said high temperature environment.

* * * * *

UNITED STATES PATENT AND TRADEMARK OFFICE
CERTIFICATE OF CORRECTION

PATENT NO. : 4,694,119

DATED : Sep. 15, 1987

INVENTOR(S) : Johannes B. Groenewegen

It is certified that error appears in the above-identified patent and that said Letters Patent is hereby corrected as shown below:

In the Abstract at line 14, "was" should be --wax--
Column 2, line 56, "innerhousing" should be --inner housing--
Column 3, line 27, "deactiviation" should be --deactivation--
Column 3, line 55, "orthoganally" should be --orthogonally--
Column 4, lines 36-37, "innerconnection" should be --interconnection--
Column 4, line 47, "innerconnections" should be --interconnections--
Column 4, line 65, "temmperature" should be --temperature--
Column 5, line 18, "material" should be --materials--
Column 5, line 27, "synomym" should be --synonym--
Column 5, line 67, "thenfilled" should be --then filled--
Column 6, line 1, "36" should be --26--
Column 6, line 6-7, "organix" should be --organic--
Column 6, line 9, insert --that-- before "is"
Column 6, line 13, "16" should be --18--
Column 7, line 14, "16" should be --18--
Column 8, line 68, insert --second-- before "interior"
Column 9, line 1, insert --,-- after "items"

Signed and Sealed this

Seventeenth Day of May, 1988

Attest:

DONALD J. QUIGG

*Attesting Officer*   *Commissioner of Patents and Trademarks*